United States Patent
Wang et al.

(10) Patent No.: US 10,736,216 B1
(45) Date of Patent: Aug. 4, 2020

(54) NON-RECTANGULAR CONNECTION PAD FOR IMPROVED ELECTRICAL CHARACTERISTICS ON TRACES

(71) Applicant: Dell Products L.P., Round Rock, TX (US)

(72) Inventors: Isaac Wang, Austin, TX (US); Bhyrav Mutnury, Austin, TX (US); Sandor Farkas, Round Rock, TX (US); Wallace Ables, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/514,096

(22) Filed: Jul. 17, 2019

(51) Int. Cl.
*H05K 1/11* (2006.01)
*H05K 3/02* (2006.01)
*H05K 3/40* (2006.01)
*H05K 1/02* (2006.01)

(52) U.S. Cl.
CPC .......... *H05K 1/111* (2013.01); *H05K 1/0237* (2013.01); *H05K 3/02* (2013.01); *H05K 3/4007* (2013.01); *H05K 2201/0939* (2013.01); *H05K 2201/09418* (2013.01)

(58) Field of Classification Search
CPC ........ H05K 1/111; H05K 1/117; H05K 1/181; H05K 3/02; H05K 3/4007
See application file for complete search history.

(56) References Cited

U.S. PATENT DOCUMENTS 10,090,235 B2 * 10/2018 Ozawa ................ H01L 25/0657
2011/0248399 A1 * 10/2011 Pendse .................. H01L 21/563
257/737

* cited by examiner

*Primary Examiner* — Jeremy C Norris
(74) *Attorney, Agent, or Firm* — Norton Rose Fulbright US LLP

(57) ABSTRACT

A non-rectangular connection pad for coupling discrete components to connection pads reduces the capacitance in the connection pad area, and thus maintains a more uniform characteristic impedance along the length of the trace. The pad shape is changed to reduce the area of the pad. The reduced area reduces or eliminates change in characteristic impedance of the trace incorporating the connection pad and discrete component attached to the connection pad. An irregular pad shape may be used to decrease the soldering area of the discrete component, while still maintaining wettability of the solder. One example of such a non-rectangular connection pad is a C-shaped connection pad. Such connection pad shapes can be used on traces for high-speed circuits (e.g., PCIe, USB, SATA, and other traces carrying signals above 1 GHz).

20 Claims, 4 Drawing Sheets

NON-RECTANGULAR CONNECTION PAD FOR IMPROVED ELECTRICAL CHARACTERISTICS ON TRACES

FIELD OF THE DISCLOSURE

The instant disclosure relates to information handling systems. More specifically, portions of this disclosure relate to connection pads and traces for interconnecting components in information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The components in an information handling system are conventionally connected together through signal lines, sometimes referred to as traces, that travel along or through a printed circuit board (PCB). For example, an information handling system's motherboard may include thousands of signal lines providing power to and communications between components such as central processing units (CPUs), graphical processing units (GPUs), memory, communication cards, disk drives, and other peripherals. One challenge in PCB design is to maintain the desired characteristic impedance along the entire trace of the signal from one component to another. Interruptions along the trace, including via transitions, discrete resistors and capacitors, and connector leads create discontinuities that negatively affect the signal quality. The problem is exaggerated when the traces are operated at high speeds, such as above 1 GHz. Various techniques have been developed to battle these interruptions, but they all come with drawbacks.

When a high-speed signal like PCIe traverses the PCB, the characteristic impedance is maintained by the proper design of the trace geometry. That is, the width, thickness, curves, heights, and other geometrical characteristics of the trace can be adjusted to obtain a desired impedance. However, when the trace connects to a discrete component, such as a capacitor, a discontinuity occurs. The discontinuity is a result of the capacitance of the soldering pads to allow connection of the discrete component to the traces. An example is shown in FIG. 1, where traces 102A-B and 104A-B are interrupted by connection pads 106A, 106B, 108A, and 108B. The connection pads 106A-B and 108A-B are larger than the underlying traces 102A-B and 104A-B because the connection pads must be visible and accessible to allow installation of the discrete component, such as by soldering the component to the connection pads. This results in the connection pad size being larger than the trace width, which creates a capacitive discontinuity in the pad that effectively reduces the characteristic impedance and creates a signal reflection. When a signal traveling the trace at high-speed encounters the connection pad, some of the signal is transmitted through the connection pad to the component and some of the signal is reflected back from the connection pad.

One conventional technique to reduce the discontinuity resulting from the capacitance is to void a region of the printed circuit board underneath the component. The voiding requires the area of the printed circuit board being voided to be clear of signals on adjacent layers. Recent information handling systems are becoming smaller in size, such as in smaller and thinner laptops and cellular phones, while the systems are offering more features that require more components in the smaller space. Such systems have many traces in a small area for connecting together the components in the small form factor. Voiding part of the PCB in such systems introduces routing challenges for how to be able to fit all the required traces around such voids.

Shortcomings mentioned here are only representative and are included to highlight problems that the inventors have identified with respect to existing information handling systems and sought to improve upon. Aspects of the information handling systems described below may address some or all of the shortcomings as well as others known in the art. Aspects of the improved information handling systems described below may present other benefits than, and be used in other applications than, those described above.

SUMMARY

Embodiments of this disclosure provide a solution to reduce the capacitance in the connection pad area, and thus maintain a more uniform characteristic impedance along the length of the trace. In some embodiments, the pad shape is changed to reduce the area of the pad at the connection pad. The reduced area minimizes change in characteristic impedance of the trace incorporating the connection pad and discrete component attached to the connection pad. An irregular pad shape may be used to decrease the soldering area of the discrete component, while still maintaining wettability of the solder. In one embodiment, a C-shape connection pad is coupled to the trace, instead of the conventional rectangular shape such as shown in FIG. 1. Such connection pad shapes are useful for high-speed circuits (e.g., PCIe, USB, SATA, and other traces carrying signals above 1 GHz).

The wettability of the solder may be maintained by maintaining the perimeter of the connection pad, such as by having pieces of the connection pad being equal to or greater than the width of trace to prevent traces from peeling off the board during soldering. Embodiments of the disclosure are tested and show compliance with IPC specs, and the testing reveals no solderability concerns. The solder fillet will try to wet up the metallization of the discrete component based on the volume of the solder paste that is printed. The more paste that is put down, the taller the heel fillet will be and the higher the component will be lifted from the PCB. The wetting under the part on a copper connection pad show approximate uniformity regardless of the connection pad shape. By adjusting the solder paste volume, the part can be raised approximately 2-4 mils higher. This phenomenon helps reducing the capacitance even further.

According to one embodiment, an apparatus includes a first connection pad terminating a first trace on a printed circuit board (PCB), wherein the connection pad has a non-rectangular shape, and wherein a width of any portion of the first connection pad does not exceed a width of the first trace by more than 10%. The first connection pad may be a C shape, an S shape, a 9 shape, or another non-solid rectangular shape. The apparatus may also include a second connection pad terminating a second trace on the printed circuit board (PCB), wherein the connection pad has a non-rectangular shape, wherein a width of any portion of the second connection pad does not exceed a width of the second trace by more than 10%. The second connection pad may be a mirror image of the first connection pad. The second connection pad may be a C shape, an S shape, a 9 shape, or another non-solid rectangular shape. An electronic component may be soldered to the connection pad, with the electronic component coupling the first trace to the second trace.

According to one embodiment, an information handling system may include a printed circuit board (PCB) with a first connection pad terminating a first trace on a printed circuit board (PCB), wherein the connection pad has a non-rectangular shape, and wherein a width of any portion of the first connection pad does not exceed a width of the first trace by more than 10%; and/or a second connection pad terminating a second trace on the printed circuit board (PCB), wherein the connection pad has a non-rectangular shape, wherein a width of any portion of the second connection pad does not exceed a width of the second trace by more than 10%. The first and second connection pads may have the C shape, S shape, or 9 shape described herein, or another non-solid rectangular shape. An electronic component may be soldered to the connection pad, to form a circuit between the first trace to the second trace. The circuit may be used as a bus for a peripheral component interface express (PCIe) bus, with the discrete component being an AC coupling capacitor.

A non-solid rectangular shape connection pad may include a number of segments, with the individual segments having a width approximately the same as the trace coupled to the connection pad. A C-shape connection pad may include a first perpendicular segment coupled to the first trace; a first and a second parallel segment coupled at opposite ends of the first perpendicular segment, wherein a width of the first perpendicular segment, the first parallel segment, and the second parallel segment does not exceed a width of the first trace by more than 10%. A S-shape connection pad may include a first, a second, and a third parallel segment, wherein the second parallel segment is coupled to the first trace; and a first and a second perpendicular segment, the first perpendicular segment coupling the first and the second parallel segments, the second perpendicular segment coupling the second and the third parallel segments, the first and the second perpendicular segment at opposite ends of the second parallel segment, wherein a width of the first and the second perpendicular segment, and the first, the second, and the third parallel segment each does not exceed a width of the first trace by more than 10%. A 9-shape connection pad may include a first, a second, and a third parallel segment, wherein the second parallel segment is coupled to the first trace; and a first, a second, and a third perpendicular segment, the first perpendicular segment coupling the first and the second parallel segment, the second perpendicular segment coupling the first and the second parallel segment, the third perpendicular segment coupling the second and the third parallel segment, wherein a width of the first, the second, and the third perpendicular segment, and the first, the second, and the third parallel segment each does not exceed a width of the first trace by more than 10%.

According to another embodiment, a method may include patterning a conductive layer on a printed circuit board (PCB). The patterning may include patterning a first connection pad at an end of a first trace, wherein the connection pad has a non-rectangular shape, and wherein a width of any portion of the first connection pad does not exceed a width of the first trace by more than 10%; and/or patterning a second connection pad at an end of a first trace, wherein the connection pad has a non-rectangular shape, and wherein a width of any portion of the first connection pad does not exceed a width of the first trace by more than 10%, wherein the second connection pad is a mirror image of the first connection pad.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
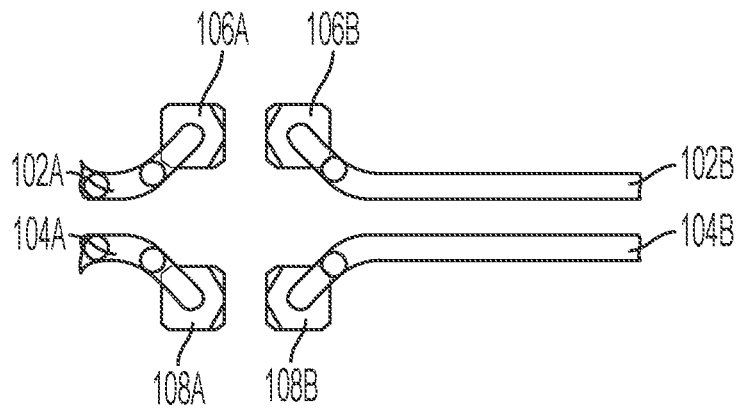
FIG. 1 is a top-down view of conventional connection pads coupled to traces on a printed circuit board.
Figure 2:
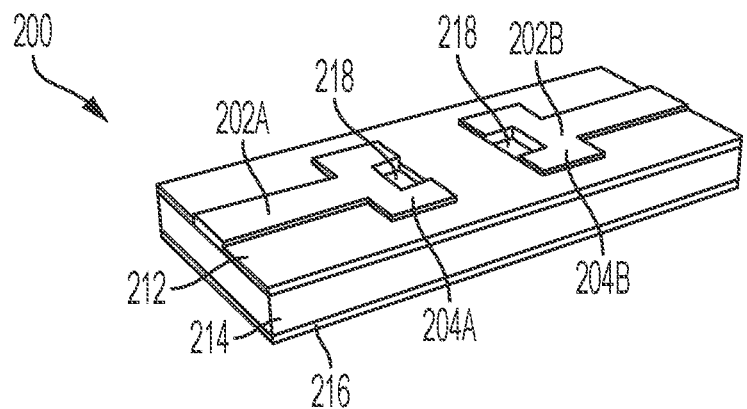
FIG. 2 shows a prospective view of a C-shaped connection pad coupled to a trace on a printed circuit board according to some embodiments of the disclosure.

The buses may be embodied as traces on a printed circuit board (PCB). The traces may include connection pads for connecting discrete components within the traces. Embodiments of the invention provide for non-rectangular shapes for the connection pads to improve the electrical characteristics of the buses. In one example embodiment, the non-rectangular connection pad may be a C-shaped connection pad. FIG. 2 shows a prospective view of a C-shaped connection pad coupled to a trace on a printed circuit board according to some embodiments of the disclosure. A PCB 200 includes traces 202A and 202B, having a width W. Connection pads 204A and 204B terminate the traces 202A and 202B, respectively. The connection pads 204A-B have a C-shape such that the width W of the traces 202A-B is maintained through the connection pads 204A-B. That is, throughout the C shape, the width W is approximately maintained through the entire C shape. "Approximately" with regard to the width may refer to any portion of the connection pad 204A not exceeding a width of the trace 202A by more than 10%. This width difference may be insignificant enough to prevent or significantly reduce the reflections from the connection pad 204A returning to the trace 202A. The reduction in conductive material reduces the pad capacitance, while maintaining sufficient conductive material to be solderable to an external component. The reduction in capacitance provides better control over the impedance.

The C-shape may include one perpendicular segment coupled to the trace 202A, the perpendicular segment having a width approximately equal to a width of the trace 202A and a length selected to correspond to a size of the component that will be soldered to the connection pad 204A. The perpendicular segment may terminate in two parallel segments, the parallel segments extending lengthwise parallel to the trace 202A and having a width approximately equal to a width of the trace 202A. The length of these two parallel segments may be selected to correspond to a size of the component that will be soldered to the connection pad 204A. The connection pad 204B may be a mirror image of the connection pad 204A.

A discrete component (not shown) is coupled to the connection pads 204A-B to create an electrical path that extends from the trace 202A to the connection pad 204A to the discrete component to the connection pad 204B to the trace 202B. Little or no width change is encountered by a signal passing through the discrete component from the trace 202A to the trace 202B. The connection pads 204A-B may be copper or another conductor surrounded by an insulator layer 212. PCB laminate layer 214 may be stacked over a reference plane 216 to separate the reference plane 216 from signals. A solder mask 212 is applied on top of the PCB laminate layer 214. In some embodiments, a void 218 is located in the PCB laminate layer 214 to further reduce capacitance of the contact pad.

Figure 3:
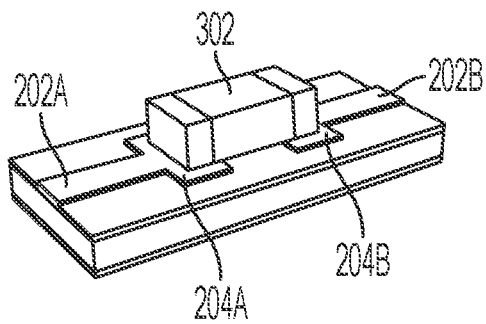
FIG. 3 shows a perspective view of a C-shaped connection pad and trace with discrete component according to some embodiments of the disclosure.
Figure 4:
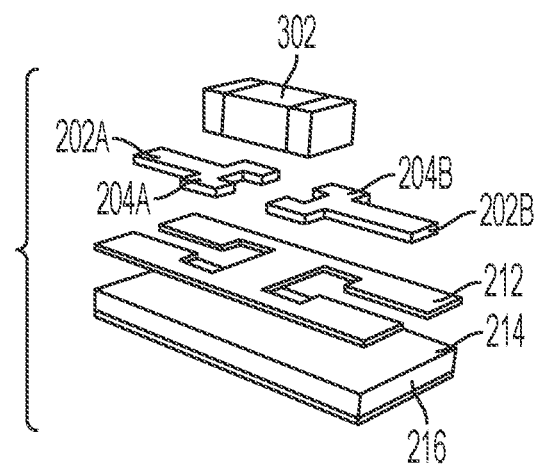
FIG. 4 shows a blow-out view of a C-shaped connection pad, trace, and discrete component according to some embodiments of the disclosure.

A discrete component may be coupled to the connection pad as shown in FIG. 3, which shows a perspective view of a C-shaped connection pad and trace with discrete component according to some embodiments of the disclosure. The entire structure of the traces, connection pads, and discrete component are shown in the blow-out view of FIG. 4. A discrete component 302, such as an AC coupling capacitor, or a resistor, is coupled to the connection pads 204A and 204B by soldering the component 302. The solder wets the connection pads 204A and 204B in a similar manner to conventional rectangular pads because the perimeter of the connection pads 204A and 204B is similar in shape and size to the conventional rectangular pad, despite the C-shape of the connection pad 204A-B resulting in less conductive metallization area in the connection pads 204A-B. More specifically, the non-rectangular connection pads 204A-B may have an outer perimeter, defined by the perimeter exposed after connection of the discrete component, that is approximately the same as a rectangular connection pad of the same length and width. "Approximately" may refer to a perimeter that is within 5-10% of the perimeter for a rectangular connection pad. For example, the corners of the C-shaped connection pad 204A-B may be rounded, resulting in a slightly decreased perimeter but still allow wetting of the solder and a reduction of the parasitic capacitance. Maintaining a similar perimeter length in the non-rectangular connection pads can be important as the strength for the solder connection is proportional to the perimeter of the pad and solder does not wet where metal is removed. Thus, reduction in the perimeter length may reduce the amount of wetting of the solder and reduce the strength of the connection.

Figure 5:
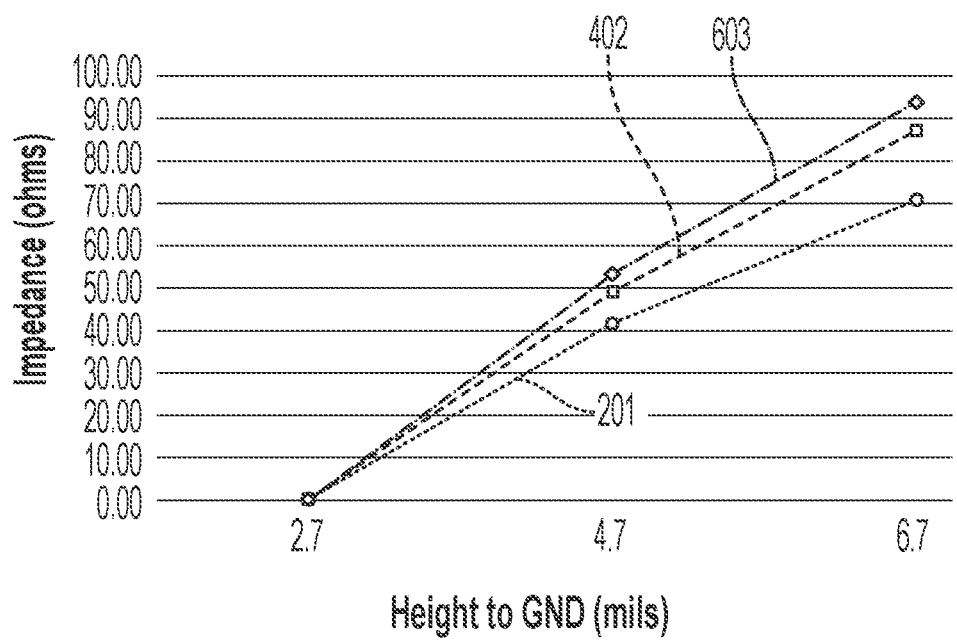
FIG. 5 shows a graph illustrating impedance improvement percentage of the non-rectangular connection pads according to some embodiments of the disclosure for various size component pads compared to conventional rectangular connection pads.
Figure 6:
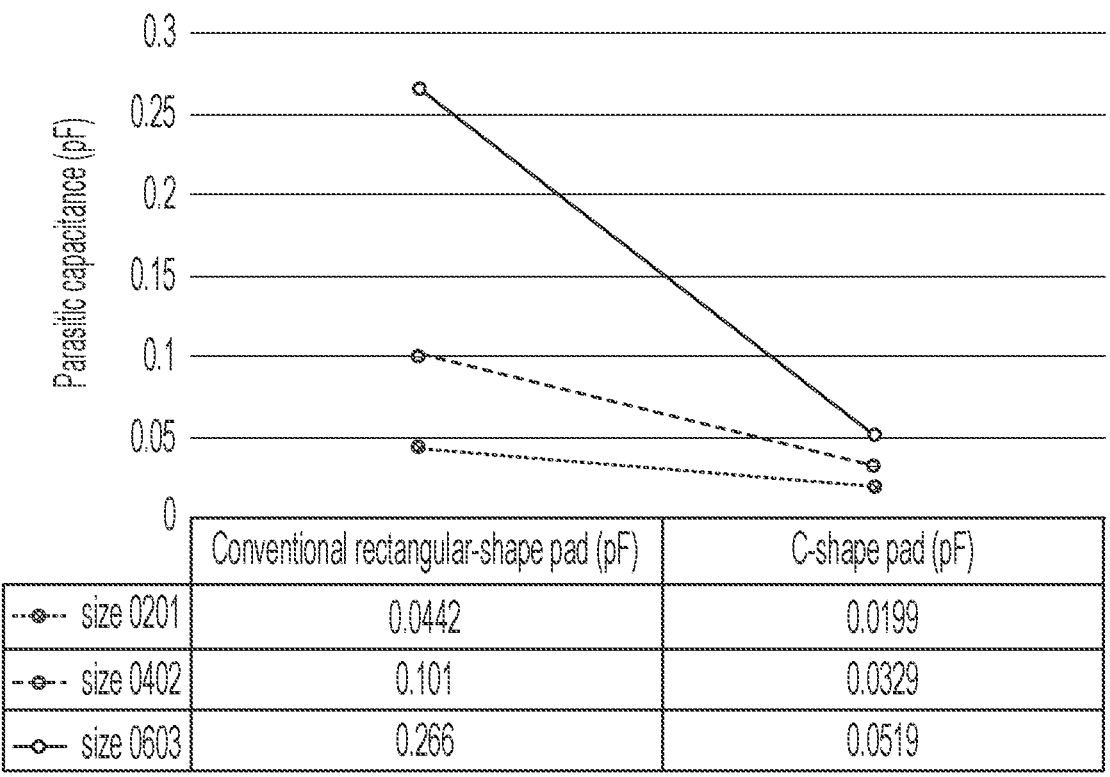
FIG. 6 shows a graph illustrating parasitic capacitance of the non-rectangular connection pads according to some embodiments of the disclosure for various size component pads compared to conventional rectangular connection pads.

Simulation results for electrical characteristics of a C-shaped soldering fillet at 2-mil width for 0201, 0402 and 0603 components are shown in FIG. 5 and FIG. 6. 0201, 0402 and 0603 components are industry-standard sizes for components. A 0201 has dimensions of 20 mils×10 mils; a 0402 has dimensions of 40 mils×20 mils; and a 0603 has dimensions of 60 mils×30 mils. FIG. 5 is a graph illustrating impedance of the non-rectangular connection pads according to some embodiments of the disclosure for various size component pads compared to conventional rectangular connection pads. Using a non-rectangular pad, such as the C-shaped pad of FIG. 2, FIG. 3, and FIG. 4 results in a change in solder size that lifts the component further off the PCB and the opening in the C-shape creates a window that effectively increases the height of the component from a ground plane of the PCB. The elevated component resulting from the solder wetting on the non-rectangular connection pad results in an increase in impedance. The impedance graphs are normalized to a 0 percent baseline at a 2.7 mil dielectric height. FIG. 6 is a graph illustrating parasitic capacitance of the non-rectangular connection pads according to some embodiments of the disclosure for various size component pads compared to conventional rectangular connection pads. The simulations of FIG. 6 calculate capacitance assuming a dielectric height of 2.7 mils, a dielectric constant of 3.8, and a C-shape width of 12 mils. The parasitic capacitance introduced by the C-shaped connection pad is reduced in comparison to the conventional rectangular connection pad for each size component. The capacitance reduction can be approximately 50-75 percent for a C-shaped connection pad.

Although a C-shaped connection pad is described above, other non-rectangular connection pad shapes may result in the same reduction in parasitic capacitance and improvement in the electrical characteristics of buses. For example, a S-shaped connection pad is shown in FIG. 7, and a 9-shaped connection pad is shown in FIG. 8.

Figure 7:
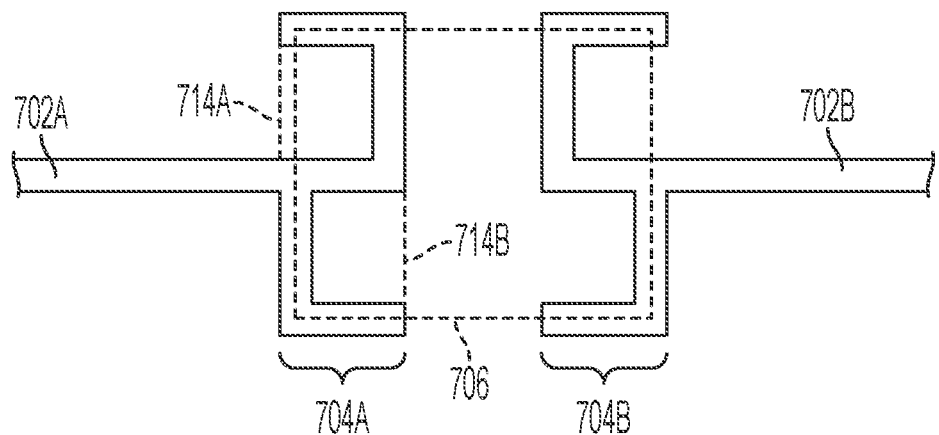
FIG. 7 shows a top-down view of a S-shaped connection pad according to some embodiments of the disclosure.

FIG. 7 shows a top-down view of a S-shaped connection pad according to some embodiments of the disclosure. A trace 702A may terminate at connection pad 704A; and a trace 702B may terminate at connection pad 704B. The connection pads 704A and 704B may be mirror images of each other. The width of any part of the connection pads 704A-B is approximately the same as the width of the trace 702A. The S-shaped connection pad 704A includes three parallel segments that are parallel to the trace 702A. The three parallel segments are joined by two segments that are perpendicular to the three parallel segments, such that one perpendicular segment couples a first and a second of the parallel segments and another perpendicular segment couples a second and a third parallel segment. The two perpendicular segments do not contact each other. An outline of a discrete component 706 is shown extending between the two connection pads 704A-B to create an electrical path from trace 702A to trace 702B. The discrete component 706 may be soldered to the connection pads 704A-B. The length of the perimeter around an outside of the component 706 is approximately the same as a conventional rectangular connection pad. For example, the only missing perimeter underneath the component 706 is one segment that if present would connect the first and second parallel segments at an end of the parallel segments opposite the first perpendicular segment. In some examples, the perimeter length of the connection pad 704A may be up to 25% shorter than a conventional rectangular connection pad, but provide similar wetting capability for soldering the component 706. The absent metal, corresponding to portions 714A-B of connection pad 704A, decreases parasitic capacitance by reducing the metallized area of the connection pad 704A.

Figure 8:
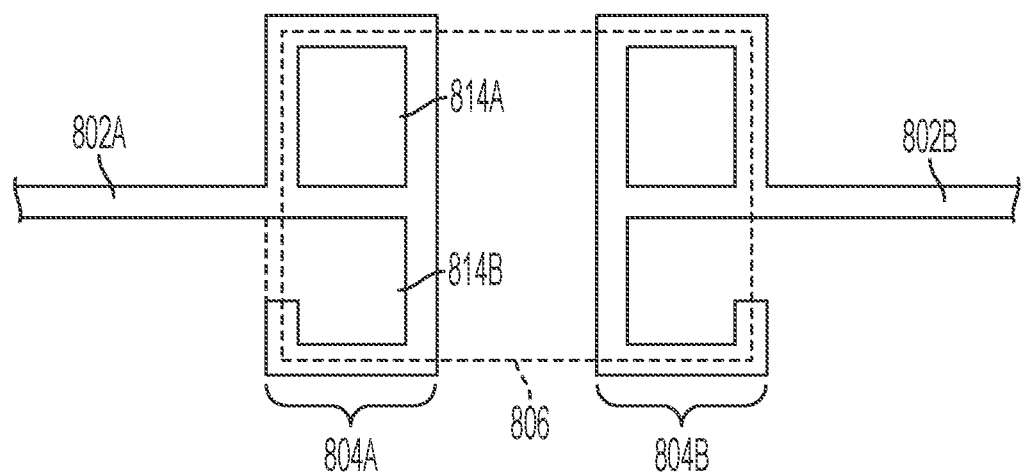
FIG. 8 shows a top-down view of a 9-shaped connection pad according to some embodiments of the disclosure.

FIG. 8 shows a top-down view of a 9-shaped connection pad according to some embodiments of the disclosure. A trace 802A may terminate at connection pad 804A; and a trace 802B may terminate at connection pad 804B. The connection pads 804A and 804B may be mirror images of each other. The width of any part of the connection pads 804A-B is approximately the same as the width of the trace 802A. The 9-shaped connection pad 804A includes three parallel segments that are parallel to the trace 802A. The three parallel segments are joined by three segments that are perpendicular to the three parallel segments, such that a first and a second perpendicular segment couples a first and a second of the parallel segments and a third perpendicular segment couples a second and a third parallel segment. The three perpendicular segments do not contact each other. An outline of a discrete component 806 is shown extending between the two connection pads 804A-B to create an electrical path from trace 802A to trace 802B. The discrete component 806 may be soldered to the connection pads 804A-B. The length of the perimeter around an outside of the component 806 is approximately the same as a conventional rectangular connection pad of the same length and width. For example, the only missing perimeter underneath the component 806 is a portion of one segment that if present would connect the second and third parallel segments. In some examples, the perimeter length of the connection pad 804A may be up to 10% shorter than a conventional rectangular connection pad but provide similar wetting capability for soldering the component 806. The absent metal, corresponding to portions 814A-B of connection pad 804A, decreases parasitic capacitance by reducing the metallized area of the connection pad 804A. Although a 9-shape is shown, other variants may include an 8-shape, which may be formed when the perpendicular only perpendicular segment that does not extend completely between two parallel segments is extended to couple to parallel segments on both ends of the perpendicular segment. Although the 8-shape has a similar perimeter to a conventional solid rectangular connection, the 8-shape and other similar shapes are non-solid with the missing metal portions reducing the parasitic capacitance and improving impedance matching with the trace by allowing the effective width of the connection pad to be approximately the same as the trace terminating at the connection pad.

A method of manufacturing printed circuit boards, such as for information handling systems, with reduced parasitic capacitance and improved impedance characteristics can involve the printing of connection pads with shapes and characteristics described above. For example, a printed circuit board comprising several layers of insulators and/or conductors may have a top, exposed conductive layer patterned to form the traces and connection pads, such as the shapes described above and the embodiments illustrated in FIG. 2, FIG. 7, and FIG. 8.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although information handling system components are described throughout the detailed description, aspects of the invention may be applied to the connection through buses with the connection pads described above of different kinds of components, such as graphics processing units (GPUs), central processing units (CPUs), and digital signal processors (DSPs). As another example, although some layers are described and illustrated throughout the application, a layer may include multiple sub-layers of the same or different materials to accomplish the same function. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
a first connection pad terminating a first trace on a printed circuit board (PCB), wherein the connection pad has a non-rectangular shape, wherein the connection pad comprises a plurality of segments, and wherein a width of any portion of the first connection pad does not exceed a width of the first trace by more than 10%.

2. The apparatus of claim 1, wherein the first connection pad comprises a C shape.

3. The apparatus of claim 1, wherein the first connection pad comprises a S shape.

4. The apparatus of claim 1, further comprising a second connection pad terminating a second trace on the printed circuit board (PCB), wherein the connection pad has a non-rectangular shape, wherein a width of any portion of the second connection pad does not exceed a width of the second trace by more than 10%.

5. The apparatus of claim 4, wherein the second connection pad comprises a C shape.

6. The apparatus of claim 4, wherein the second connection pad comprises a S shape.

7. The apparatus of claim 4, wherein the second connection pad is a mirror image of the first connection pad.

8. The apparatus of claim 4, further comprising an electronic component soldered to the connection pad, wherein the electronic component couples the first trace to the second trace.

9. The apparatus of claim 4, wherein the first trace and the second trace comprise a peripheral component interface express (PCIe) bus.

10. An information handling system, comprising:
a printed circuit board (PCB), comprising:
a first connection pad terminating a first trace on a printed circuit board (PCB), wherein the connection pad has a non-rectangular shape, wherein the first connection pad comprises a plurality of segments, and wherein a width of any portion of the first connection pad does not exceed a width of the first trace by more than 10%;
a second connection pad terminating a second trace on the printed circuit board (PCB), wherein the connection pad has a non-rectangular shape, wherein a width of any portion of the second connection pad does not exceed a width of the second trace by more than 10%.

11. The information handling system of claim 10, wherein the second connection pad is a mirror image of the first connection pad.

12. The information handling system of claim 10, wherein the first connection pad comprises a C shape.

13. The information handling system of claim 12, wherein the first connection pad comprises:
a first perpendicular segment coupled to the first trace;
a first and a second parallel segment coupled at opposite ends of the first perpendicular segment,
wherein a width of the first perpendicular segment, the first parallel segment, and the second parallel segment does not exceed a width of the first trace by more than 10%.

14. The information handling system of claim 10, wherein the first connection pad comprises a S shape.

15. The information handling system of claim 14, wherein the first connection pad comprises:
a first, a second, and a third parallel segment, wherein the second parallel segment is coupled to the first trace; and
a first and a second perpendicular segment, the first perpendicular segment coupling the first and the second parallel segments, the second perpendicular segment coupling the second and the third parallel segments, the first and the second perpendicular segment at opposite ends of the second parallel segment,
wherein a width of the first and the second perpendicular segment, and the first, the second, and the third parallel segment each does not exceed a width of the first trace by more than 10%.

16. The information handling system of claim 10, wherein the first connection pad comprises a 9 shape.

17. The information handling system of claim 16, wherein the first connection pad comprises:
a first, a second, and a third parallel segment, wherein the second parallel segment is coupled to the first trace; and
a first, a second, and a third perpendicular segment, the first perpendicular segment coupling the first and the second parallel segment, the second perpendicular segment coupling the first and the second parallel segment, the third perpendicular segment coupling the second and the third parallel segment,
wherein a width of the first, the second, and the third perpendicular segment, and the first, the second, and the third parallel segment each does not exceed a width of the first trace by more than 10%.

18. The information handling system of claim 10, further comprising an electronic component soldered to the connection pad, wherein the electronic component couples the first trace to the second trace.

19. The information handling system of claim 10, wherein the first trace and the second trace comprise a peripheral component interface express (PCIe) bus.

20. A method, comprising:
patterning a conductive layer on a printed circuit board (PCB), the patterning comprising:
patterning a first connection pad at an end of a first trace, wherein the connection pad has a non-rectangular shape, wherein the connection pad comprises a plurality of segments, and wherein a width of any portion of the first connection pad does not exceed a width of the first trace by more than 10%; and
patterning a second connection pad at an end of a first trace, wherein the connection pad has a non-rectangular shape, and wherein a width of any portion of the first connection pad does not exceed a width of the first trace by more than 10%, wherein the second connection pad is a mirror image of the first connection pad.

* * * * *